United States Patent
Nakamura et al.

(10) Patent No.: US 9,891,101 B2
(45) Date of Patent: Feb. 13, 2018

(54) INFORMATION-READING COMPONENT AND INFORMATION-READING DEVICE UTILIZING SAME

(71) Applicants: SHINANO KENSHI CO., LTD., Ueda-shi, Nagano (JP); SHINSHU UNIVERSITY, Matsumoto-shi, Nagano (JP)

(72) Inventors: Hiroyuki Nakamura, Ueda (JP); Musubu Ichikawa, Ueda (JP)

(73) Assignees: SHINANO KENSHI CO., LTD., Nagano (JP); SHINSHU UNIVERSITY, Nagano (JP)

( * ) Notice: Subject to any disclaimer, the term of this patent is extended or adjusted under 35 U.S.C. 154(b) by 199 days.

(21) Appl. No.: 14/770,600

(22) PCT Filed: Feb. 27, 2014

(86) PCT No.: PCT/JP2014/054935
§ 371 (c)(1),
(2) Date: Aug. 26, 2015

(87) PCT Pub. No.: WO2014/133098
PCT Pub. Date: Sep. 4, 2014

(65) Prior Publication Data
US 2016/0011041 A1 Jan. 14, 2016

(30) Foreign Application Priority Data
Feb. 28, 2013 (JP) ................. 2013-039685

(51) Int. Cl.
*G01J 1/42* (2006.01)
*G06K 7/10* (2006.01)
*H01L 27/146* (2006.01)
*H04N 1/028* (2006.01)
*H04B 10/00* (2013.01)
*G01D 5/26* (2006.01)

(52) U.S. Cl.
CPC ................. *G01J 1/42* (2013.01); *G01D 5/26* (2013.01); *G06K 7/10* (2013.01); *G06K 7/10732* (2013.01);
(Continued)

(58) Field of Classification Search
CPC ... G01J 1/42; G06K 7/10821; G06K 7/10732; G06K 7/10831; G06K 7/10; G01D 5/26; H04B 10/00; H01L 27/146; H04N 1/028
See application file for complete search history.

(56) References Cited

U.S. PATENT DOCUMENTS 6,252,218 B1 6/2001 Chou
7,561,758 B2 * 7/2009 Huang ............... H04N 1/02865
250/559.09

(Continued)

FOREIGN PATENT DOCUMENTS

JP 60032485 A 2/1985
JP S61168140 A 7/1986
(Continued)

OTHER PUBLICATIONS

International Search Report corresponding to Application No. PCT/JP2014/054935; dated Apr. 8, 2014.
(Continued)

*Primary Examiner* — Tony Ko
(74) *Attorney, Agent, or Firm* — Cantor Colburn LLP (57) ABSTRACT

An information-reading element may be provided, which can be made small, and allows the number of adjustment steps to be reduced, and an information-reading device may be provided. An information-reading element may be provided and equipped with a light-emitting element, which serves as a polarized light-emitting part for emitting polarized light as outgoing light, and a light-receiving element, which serves as a polarized light-receiving part for receiving (Continued)

the polarized light as returning light after the polarized light is reflected off a reflecting plate, said reflecting plate being a target object from which information is to be read, wherein the light-emitting element and the light-receiving element have different polarization characteristics from each other.

3 Claims, 6 Drawing Sheets

(52) U.S. Cl.
CPC ..... *G06K 7/10821* (2013.01); *G06K 7/10831* (2013.01); *H01L 27/146* (2013.01); *H04B 10/00* (2013.01); *H04N 1/028* (2013.01)

(56) References Cited

U.S. PATENT DOCUMENTS

| | | |
|---|---|---|
| 2004/0165102 A1 | 8/2004 | Komatsu et al. |
| 2006/0044628 A1 | 3/2006 | Huang |
| 2007/0181790 A1 | 8/2007 | Chin |

FOREIGN PATENT DOCUMENTS

| | | |
|---|---|---|
| JP | S62149252 A | 7/1987 |
| JP | 01268165 A | 10/1989 |
| JP | 05276312 A | 10/1993 |
| JP | 07292135 A | 11/1995 |
| JP | 2000236416 A | 8/2000 |
| JP | 2000341472 A | 12/2000 |
| JP | 2001169147 A | 6/2001 |
| JP | 2002278504 A | 9/2002 |
| JP | 2004260798 A | 9/2004 |

OTHER PUBLICATIONS

Extended European Search Report corresponding to Application No. 14756673.1-1806/2963907 PCT/JP2014/054935; dated Oct. 10, 2016.

Japanese Notice of Reasons for Rejection corresponding to Application No. JP2014-037248; dated Nov. 4, 2015, with English translation.

* cited by examiner

Fig.7A
READ OBJECT PRESENT

Fig.7B
READ OBJECT ABSENT

Fig.7C
READ OBJECT PRESENT

Fig.7D
READ OBJECT ABSENT

INFORMATION-READING COMPONENT AND INFORMATION-READING DEVICE UTILIZING SAME

This is the U.S. national stage of application No. PCT/JP2014/054935, filed on Feb. 27, 2014. Priority under 35 U.S.C. § 119(a) and 35 U.S.C. § 365(b) is claimed from Japanese Application No. 2013-039685, filed Feb. 28, 2013, the disclosure of which is also incorporated herein by reference.

TECHNICAL FIELD

The present invention relates to a device reading information on a surface of an object in a non-contact manner and a element reading information to be utilized in the device.

BACKGROUND ART

Conventionally, there is a demand for reading information on a surface of an object in a non-contact manner, and a device to which optical reflection has been applied is particularly known. Examples thereof are a barcode reading device, a QR code (registered trademark) reading device, a facsimile reading device, a rotary encoder, and a linear encoder.

Such a device has been used in various fields since it does not cause wear damage of the object due to the non-contact reading and is excellent in durability due to the optical type.

However, there are recently raised more market demands for size reduction of the device, high-resolution of information to be read, reduction of production cost, and the like.

Figure 8:
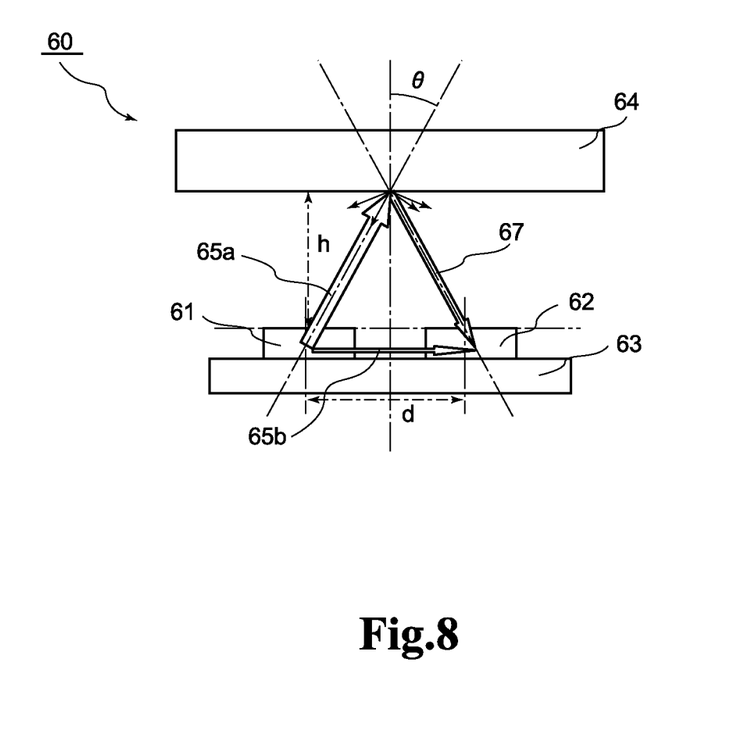
FIG. 8 is a cross-sectional view illustrating a conventional information-reading element.

In a conventional optical information-reading element 60, a light-emitting element 61 and a light-receiving element 62 are arranged on the same plane with a substrate 63 as illustrated in FIG. 8. Light (outgoing light 65a) from the light-emitting element 61 is reflected on a read object 64 (a reflecting part) and returns to the light-receiving element 62 as reflecting light 67 (returning light), and the outgoing light 65a and the returning light 67 are not parallel and generate a reflecting angle θ at the time of reflection. To irradiate the read object 64 with the outgoing light 65a and guide the returning light 67 into the light-receiving element 62 in this configuration, the light-emitting element 61 and the light-receiving element 62 need to be provided with lenses (refractive lenses) refracting the outgoing light 65a and the returning light 67 as much as the reflecting angle θ or need to be inclined as much as the angle θ against the plane of the substrate 63.

Providing the refractive lenses naturally requires cost of the refractive lenses, which is contrary to cost reduction. Inclining the light-emitting element 61 and the light-receiving element 62 against the plane of the substrate 63 as an alternative method requires a dedicated jig, an inspection device, and adjustment man-hours at the time of production, which is similarly contrary to cost reduction.

In addition, a distance h between the plane of the substrate 63 and the read object 64 needs to be longer than a dimension of each refractive lens, which is not favorable for size reduction, and when size reduction cannot be achieved, it is natural that high-resolution information cannot be read.

Further, since the light-emitting element 61 and the light-receiving element 62 are fixed at the time of production, a distance d between the light-emitting element 61 and the light-receiving element 62 cannot be changed. For this reason, the reflecting angle θ needs to be constant. To do so, the distance h must be a fixed value, and it is difficult to change the distance h flexibly.

Also, in a case in which the distance d is reduced for size reduction by providing small-sized lenses or inclining the light-emitting element 61 and the light-receiving element 62 against the plane of the substrate 63 without consideration of cost, a problem occurs in which part of the outgoing light 65a from the light-emitting element 61 directly reaches the light-receiving element 62 as outgoing light 65b. To solve this problem, a method of providing the light-emitting element 61 and the light-receiving element 62 with directional objects (lenses which are different from the aforementioned refractive lenses) to restrict directions of the outgoing light 65a and the returning light 67 or a method of providing a light shielding wall between the light-emitting element 61 and the light-receiving element 62 is needed. This causes a further increase in cost.

CITATION LIST

Patent Literature

{PTL 1} JP 05-276312 A
{PTL 2} JP 2002-278504 A
{PTL 3} JP 2000-341472 A
{PTL 4} JP 2004-260798 A
{PTL 5} JP 07-292135 A

SUMMARY OF INVENTION

Technical Problem

An object of the present invention is to provide an information-reading element and an information-reading device enabling size reduction and reduction of adjustment man-hours.

Solution to Problem

To achieve the above object, an information-reading element according to the present invention includes a polarized light emitting part emitting polarized light as outgoing light, and a polarized light receiving part receiving as returning light the outgoing light reflected on a read object as an object from which information is read, and the polarized light emitting part and the polarized light receiving part respectively have different polarization characteristics.

Also, in the information-reading element according to the present invention, a polarization characteristic changing part changing polarization characteristics of the outgoing light and the returning light is arranged at a position through which the outgoing light and the returning light pass, and the polarization characteristic changing part gives rise to a change A in the polarization characteristic when the outgoing light passes therethrough and gives rise to a change B in the polarization characteristic when the returning light passes therethrough so that the polarization characteristic of the returning light may match the polarization characteristic of the polarized light receiving part due to the change A and the change B.

Also, in the information-reading element according to the present invention, the polarized light emitting part, the polarized light receiving part, the read object, and the polarization characteristic changing part are arranged at positions intersecting with equal traces.

Also, in the information-reading element according to the present invention, the polarized light receiving part is provided on an opposite side of the read object through the polarized light emitting part, and the polarized light emitting part has a light transmission characteristic, the outgoing light emitted by the polarized light emitting part transmitting through the polarized light emitting part after being reflected on the read object as the returning light and the outgoing light reaching to the polarized light receiving part.

To achieve the above object, an information-reading device according to the present invention includes the aforementioned information-reading element.

Also, an information-reading device according to the present invention includes the plurality of information-reading elements, and wavelengths of polarized light emitted or received by the plurality of information-reading elements are different among the adjacent information-reading elements.

Advantageous Effects of Invention

According to the present invention, it is possible to provide an information-reading element and an information-reading device enabling size reduction and reduction of adjustment man-hours.

DESCRIPTION OF EMBODIMENTS

Hereinbelow, an information-reading element according to the present invention will be described based on the drawings.

Meanwhile, before detailed description of examples, common matters to the drawings will be described first. In the figures, symbols 15b, 17b, 25b, 27b, 35b, and 37b are notations in the drawings each representing a polarizing direction of linear polarization of light. For example, the symbol 15b represents that a polarizing direction is vertical to a specific plane while the symbol 17b represents that a polarizing direction is parallel to the specific plane. That is, a polarizing direction of linear polarization of light represented by the symbol 15b and a polarizing direction of linear polarization of light represented by the symbol 17b are different by 90° each other.

Each of symbols 15c and 17c represents a rotating direction of circular polarization (elliptic polarization) of light. The symbol 15c represents that light is clockwise rotation in a light traveling direction (right circular polarization/right elliptic polarization) while the symbol 17c represents that light is counterclockwise rotation in the light traveling direction (left circular polarization/left elliptic polarization). That is, the rotating directions of the circular polarization of lights represented by the symbol 15c and the symbol 17c have are opposite to each other.

In the following description, each of "light-emitting elements 11a, 21a, and 31a" corresponds to "a polarized light emitting part" in the claims, and each of "a light-receiving element 11b, a light-receiving element 21b, and a light-receiving element 31b" and "a polarizing plate 11c and a polarizing plate 31c" corresponds to "a polarized light receiving part" in the claims.

Also, each of "reflecting plates 13a, 23a, and 33a" corresponds to "an object" from which information is read in the claims and represents.

Each of "quarter-wave plates 13b, 23b, and 33b" in the figures corresponds to "a polarization characteristic changing part" in the claims.

Example 1

Example 1 will be described based on FIG. 1.

In Example 1, it is assumed that an information-reading element 10a according to the present invention is applied in an information-reading device reading a bit pattern to be used in a linear encoder or a rotary encoder as information.

The information-reading element 10a includes a glass substrate 12, and a light-emitting element 11a formed (laminated) on this glass substrate 12, a polarizing plate 11c, and a light-receiving element 11b. The glass substrate 12, the light-emitting element 11a, the polarizing plate 11c, and the light-receiving element 11b may be laminated in close contact with each other or may be laminated with air layers or transparent layers such as glass plates interposed therebetween.

The light-emitting element 11a emits outgoing light 15a. The outgoing light 15a is linearly polarized in a vertical direction (from the front side toward the backside in FIG. 1) as illustrated by a symbol 15b. An example of the light-emitting element 11a is a surface emitter such as organic EL, to which an emitting function of linear polarization can be appended by means of processing in a production procedure.

The polarizing plate 11c has an effect of transmitting only light linearly polarized in a specific direction. This polarizing plate 11c is configured so that a transmittable polarizing direction thereof may differ by 90° in comparison with linearly-polarized light emitted by the light-emitting element 11a. Thus, the light-emitting element 11a emits not only the aforementioned outgoing light 15a but also light toward a reverse direction, and the polarized light toward the reverse direction is shielded by the polarizing plate 11c and cannot reach the light-receiving element 11b.

A reflecting plate 13a and a quarter-wave plate 13b are an object from which information is read. FIG. 1 illustrates a configuration in which the quarter-wave plate 13b serving as a polarization characteristic changing part is attached to the reflecting plate 13a serving as a read object. The reflecting plate 13a is an object having high reflectance, and an example thereof is a mirror. The quarter-wave plate 13b is arranged on a surface of the reflecting plate 13a.

The linearly-polarized outgoing light 15a reaches the quarter-wave plate 13b. The outgoing light 15a also changes into clockwise circularly-polarized light at the time of passing through the quarter-wave plate 13b (not illustrated). The outgoing light 15a, which has changed into the circularly-polarized light, is reflected on the reflecting plate 13a after passing through the quarter-wave plate 13b. At this time, the outgoing light 15a circularly polarized in clockwise direction reaches the quarter-wave plate 13b again as counterclockwise returning light 17a. At this time, counterclockwise circularly-polarized light of the returning light 17a becomes linear-polarized light due to the effect of the quarter-wave plate 13b. The polarizing direction of this linear polarization differs by 90° from a polarizing direction of the outgoing light 15a (the polarizing direction illustrated by the symbol 15b) as illustrated by a symbol 17b.

The returning light 17a returning to the glass substrate 12 passes through the light-emitting element 11a as it is and reaches the polarizing plate 11c. As described above, the polarizing direction of this polarizing plate 11c differs by 90° from the polarizing direction of light emitted by the light-emitting element 11a. Thus, since the polarizing direction of the polarizing plate 11c corresponds to the polarizing direction of the returning light illustrated by the symbol 17b, the returning light 17a can pass through the polarizing plate 11c.

Finally, the returning light 17a reaches the light-receiving element 11b and is received. An example of the light-receiving element 11b is a photodiode. Reception of the returning light 17a in the light-receiving element 11b can cause presence of the reflecting plate 13a and the quarter-wave plate 13b as the object to be recognized.

Figure 5:
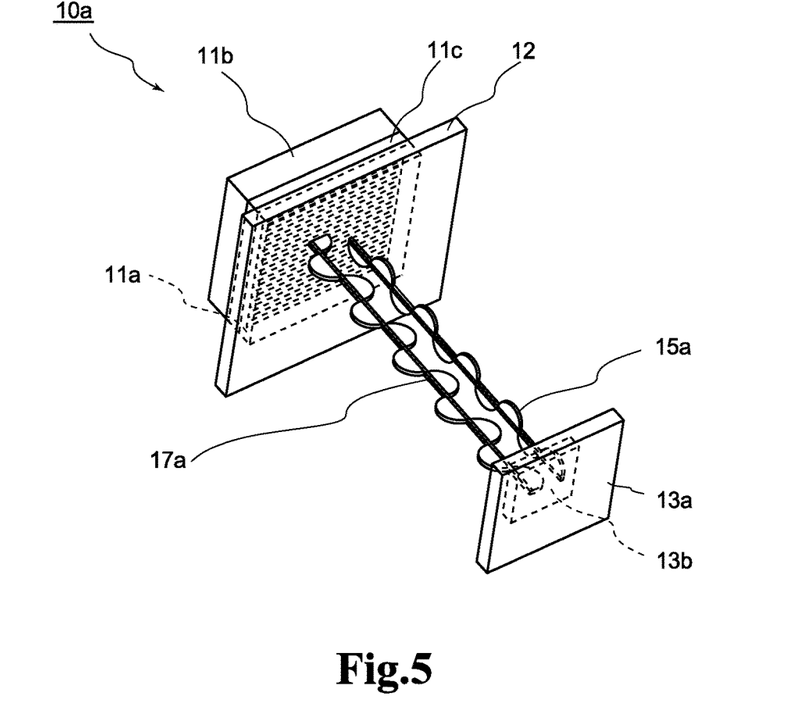
FIG. 5 is a perspective view illustrating Example 1 according to the present invention.

This configuration is illustrated in FIG. 5 as a perspective view.

The aforementioned bit pattern (used in the linear encoder or the rotary encoder) can be expressed by providing the surface of the reflecting plate 13a with a part having high reflectance and a part having low reflectance by partially marking the surface with black to control the light volume of the returning light 17a. In another method, the bit pattern can be expressed only by presence/absence of the quarter-wave plate 13b without marking the surface of the reflecting plate 13a with black. That is, a configuration of varying the polarizing direction (a polarization characteristic) of the returning light 17a at a part provided with the quarter-wave plate 13b and a part not provided with the quarter-wave plate 13b to vary the light-receiving amount in the light-emitting element 11a may be applied. In the case of this configuration, the presence of the quarter-wave plate 13b can be recognized based on the variation of the light-receiving amount in the light-emitting element 11a. That is, the quarter-wave plate 13b serves as the object from which information is read (the read object).

Meanwhile, employing both expressing the bit pattern by providing the surface of the reflecting plate 13a with the part having high reflectance and the part having low reflectance by partially marking the surface with black to control the light volume of the returning light 17a and expressing the bit pattern only by presence/absence of the quarter-wave plate 13b without marking the surface of the reflecting plate 13a with black is more preferable. That is, a configuration of partially marking the surface of the reflecting plate 13a with black to form the bit pattern and providing the non-marked part having high reflectance with the quarter-wave plate 13b may be employed.

Figure 1:
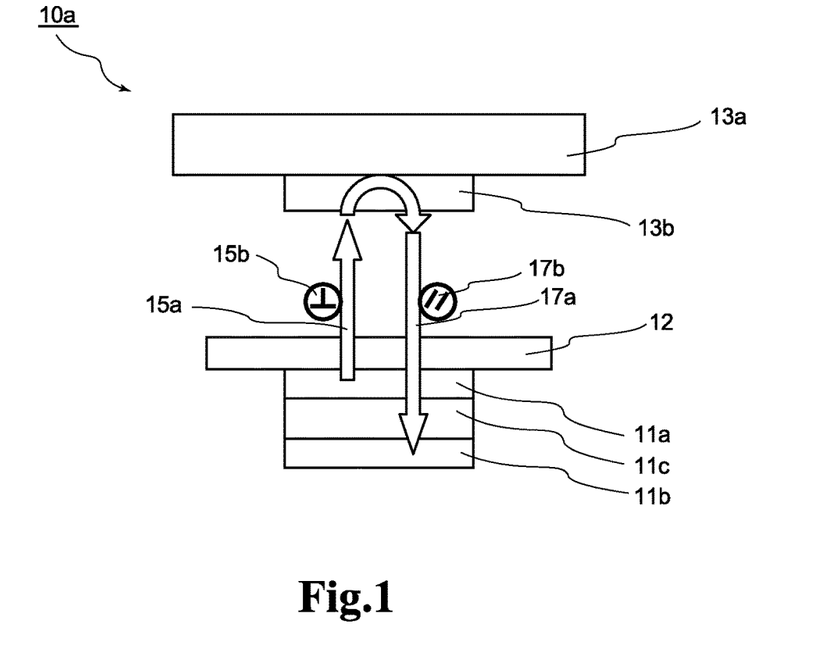
FIG. 1 is a cross-sectional view illustrating Example 1 according to the present invention.

Meanwhile, in the configuration in FIG. 1 according to the present example, the quarter-wave plate 13b is situated on the surface of the reflecting plate 13a. This configuration considers using a plate having high reflectance as the reflecting plate 13a and enabling unnecessary light coming from an opposite side (an upper side in the figure) to be eliminated. The reason for this is that reliable operations of the information-reading element is required since the information-reading element is used in a precise measuring device such as the linear encoder and the rotary encoder.

Figure 2:
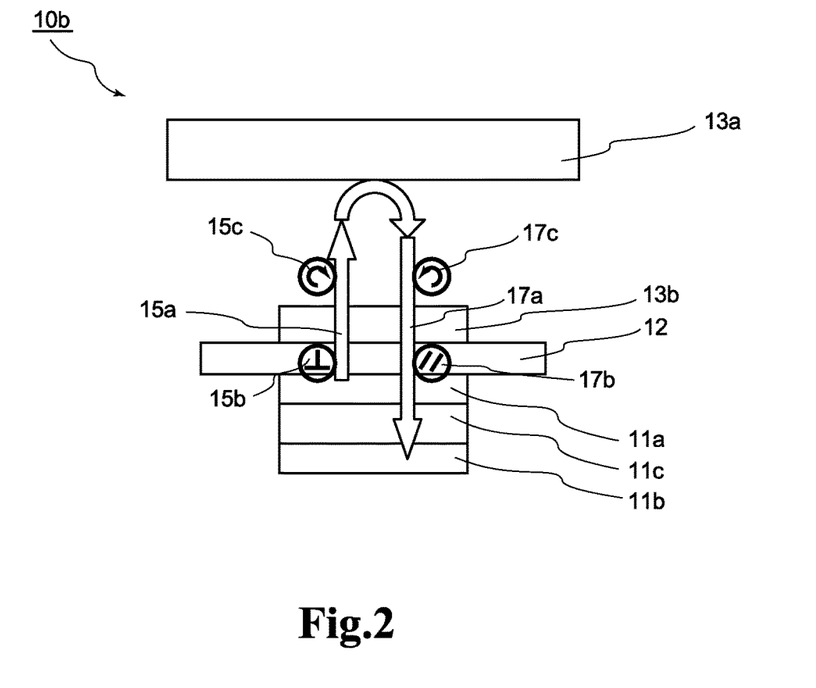
FIG. 2 is a cross-sectional view illustrating another configuration of Example 1 according to the present invention.

An information-reading element in which the quarter-wave plate 13b in FIG. 1 has been moved to a side of the glass substrate 12 is an information-reading element 10b illustrated in FIG. 2.

Although the information-reading element 10b is approximately similar to that in FIG. 1, the outgoing light 15a after passing through the quarter-wave plate 13b is clockwise circularly-polarized light in an outgoing light polarizing direction illustrated by a symbol 15c until reaching the reflecting plate 13a.

The outgoing light 15a becomes counterclockwise circularly-polarized returning light 17a having a returning light polarizing direction illustrated by a symbol 17c when the outgoing light 15a is reflected on the reflecting plate 13a. This returning light 17a becomes linearly-polarized light having the returning light polarizing direction illustrated by the symbol 17b at the time of passing through the quarter-wave plate 13b on a surface of the glass substrate 12. The returning light 17a thereafter reaches the light-receiving element 11b in a same manner as explanation that described in FIG. 1.

The aforementioned bit pattern (used in the linear encoder or the rotary encoder) can be expressed by providing the surface of the reflecting plate 13a with a part having high reflectance and a part having low reflectance by partially marking the surface with black to control the light volume of the returning light 17a.

By providing the quarter-wave plate 13b on the side of the glass substrate 12, area of the quarter-wave plate 13b that required is small, it is possible to achieve further reduction of the cost in comparison with the configuration in FIG. 1.

Also, as the object to which the outgoing light 15a is emitted, an object other than the reflecting plate 13a may be used. A sheet or the like on which a high-contrast pattern such as a barcode and a QR code has been printed can be used instead of the reflecting plate 13a. Since a black part and a white part of such a code have quite different reflectance values, a difference in the light volume of the returning light 17a is significant. By using an information-reading device having arranged therein the plurality of information-reading elements according to the present example, the content of the code can be read in a short period of time.

Also, in a case in which the light-receiving element 11b can recognize the light intensity in a multilevel, the light-receiving element 11b can read not only binary information such as the bit pattern and the code but also information having intermediate gradation (tone). An information-reading device having arranged therein the plurality of information-reading elements according to the present example in a matrix can be used as an imaging device such as an image scanner.

Although the outgoing light 15a and the returning light 17a are illustrated as separate lines in the figures, the outgoing light 15a and the returning light 17a are actually collinear.

In other words, the outgoing light 15a and the returning light 17a are light reciprocating on the same lines. That is, the light-emitting element 11a serving as a polarized light emitting part, the light-receiving element 11b serving as a polarized light receiving part, the reflecting plate 13a serving as a read object, and the quarter-wave plate 13b serving as a polarization characteristic changing part are arranged at positions intersecting the same lines.

Accordingly, a distance between the glass substrate 12 and the reflecting plate 13a can be set flexibly, unlike in a configuration of using lenses. The distance can be set freely in the range of the light-emitting amount limit of the light-emitting element and the light-receiving detection limit of the light-receiving element.

Example 2

Figure 3:
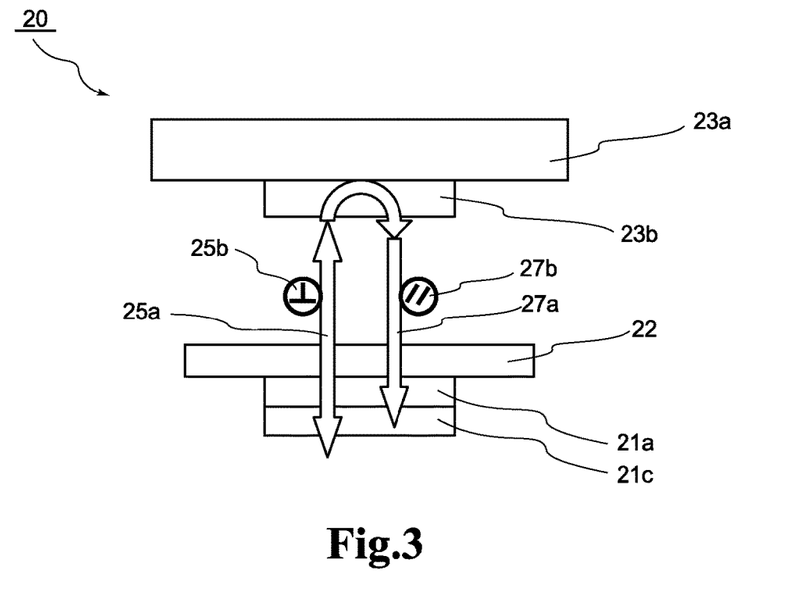
FIG. 3 is a cross-sectional view illustrating Example 2 according to the present invention.

Next, Example 2 will be described based on FIG. 3.

An information-reading element 20 includes a glass substrate 22, and a light-emitting element 21a and a light-receiving element 21b formed (laminated) on this glass substrate 22. The light-receiving element 21b has a different polarization characteristic from a polarization characteristic of the light-emitting element 21a (has a polarizing direction different by 90° to a polarizing direction of the light-emitting element 21a).

The light-emitting element 21a emits outgoing light 25a. The outgoing light 25a is linearly polarized in a vertical direction (from the front side toward the backside in FIG. 3) as illustrated by a symbol 25b.

A reflecting plate 23a and a quarter-wave plate 23b are an object from which information is read. A configuration is illustrated in which the quarter-wave plate 23b serving as a polarization characteristic changing part is attached to the reflecting plate 23a serving as a read object. The reflecting plate 23a is an object having high reflectance, and an example thereof is a mirror. The quarter-wave plate 23b is arranged on a surface of the reflecting plate 23a.

The linearly-polarized outgoing light 25a reaches the quarter-wave plate 23b. The outgoing light 25a also changes into clockwise circularly-polarized light at the time of passing through the quarter-wave plate 23b (not illustrated). The outgoing light 25a, which has changed into the circularly-polarized light, is reflected on the reflecting plate 23a after passing through the quarter-wave plate 23b. At this time, the outgoing light 25a circularly polarized clockwise reaches the quarter-wave plate 23b again as counterclockwise returning light 27a. At this time, counterclockwise circular polarization of the returning light 27a becomes linear polarization due to the effect of the quarter-wave plate 23b. The polarizing direction of this linear polarization differs by 90° from the polarizing direction of the outgoing light 25a (the polarizing direction illustrated by the symbol 25b) as illustrated by a symbol 27b.

The returning light 27a returning to the glass substrate 22 passes through the light-emitting element 21a as it is, reaches the light-receiving element 21b, and is received.

The aforementioned configuration of Example 2 is approximately equal to that of Example 1 illustrated in FIG. 1. However, in the configuration of Example 2, a sensitivity of the light-receiving element 21b itself has a polarization characteristic. In this polarization characteristic, the polarizing direction is vertical to the outgoing light polarizing direction illustrated by the symbol 25b. This configuration can dispense with the polarizing plate 11c, which is needed in the configuration in FIG. 1 to cut off light directly reaching the light-receiving element 11b from the light-emitting element 11a. Although polarized light from the light-emitting element 21a directly reaches the light-receiving element 21b since the polarizing plate 11c is not provided, the outgoing light polarizing direction illustrated by the symbol 25b according to the polarization characteristic that this polarized light possesses has no influence since the polarizing direction differs from the polarizing direction to which the light-receiving element 21b is sensitive. This enables further size reduction to be achieved.

Meanwhile, as in the configuration in FIG. 2 against the configuration in FIG. 1 in Example 1, the quarter-wave plate 23b may be provided on the side of the glass substrate 22 in Example 2 as well.

Example 3

Figure 4:
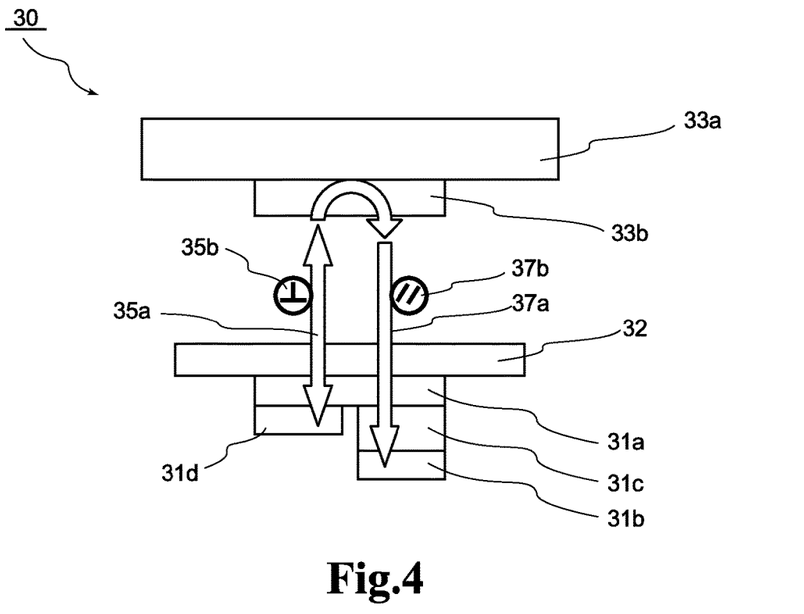
FIG. 4 is a cross-sectional view illustrating Example 3 according to the present invention.

Next, Example 3 will be described based on FIG. 4.

An information-reading element 30 includes a glass substrate 32, and a light-emitting element 31a formed (laminated) on this glass substrate 32, a light-receiving element 31b, and a light-receiving element 31d.

The light-emitting element 31a emits outgoing light 35a. The outgoing light 35a is linearly polarized in a vertical direction (from the front side toward the backside in FIG. 4) as illustrated by a symbol 35b.

A reflecting plate 33a and a quarter-wave plate 33b are an object from which information is read. A configuration is illustrated in which the quarter-wave plate 33b serving as a polarization characteristic changing part is attached to the reflecting plate 33a serving as a read object. The reflecting plate 33a is an object having high reflectance, and an example thereof is a mirror. The quarter-wave plate 33b is arranged on a surface of the reflecting plate 33a.

The linearly-polarized outgoing light 35a reaches the quarter-wave plate 33b. The outgoing light 35a also changes into clockwise circularly-polarized light at the time of passing through the quarter-wave plate 33b (not illustrated). The outgoing light 35a, which has changed into the circularly-polarized light, is reflected on the reflecting plate 33a after passing through the quarter-wave plate 33b. At this time, the outgoing light 35a circularly polarized clockwise reaches the quarter-wave plate 33b again as counterclockwise returning light 37a. At this time, counterclockwise circular polarization of the returning light 37a becomes linear polarization due to the effect of the quarter-wave plate 33b. A polarizing direction of this linear polarization differs by 90° to a polarizing direction of the outgoing light 35a (the polarizing direction illustrated by the symbol 35b) as illustrated by a symbol 37b.

The returning light 37a returning to the glass substrate 32 passes through the light-emitting element 31a as it is, reaches the light-receiving element 31b, and is received.

The aforementioned configuration of Example 3 has many similarities to that of Example 1 illustrated in FIG. 1 but is provided not only with the light-receiving element 31b receiving the returning light 37a but also with another light-receiving element 31d. This light-receiving element 31d is provided for the purpose of monitoring the light volume of the polarized light emitted by the light-emitting element 31a. Since the light-emitting element 31a keeps light emission over a long period of time, there is a case in which the light-emitting efficiency is down due to aged deterioration, and in which the light-emitting amount in response to the same input decreases. By monitoring the light-emitting amount of the light-emitting element 31a due to the light-receiving element 31d for monitoring and controlling the input in the light-emitting element 31a to keep the light-emitting amount of the light-emitting element 31a constant, the more accurate information-reading element can be achieved.

Meanwhile, the quarter-wave plate 33b may be provided on the side of the glass substrate 32 in Example 3 as well, in the same way as the configuration in FIG. 2 against the configuration in FIG. 1 in Example 1.

Example 4

Example 4 will be described based on FIG. 6.

Example 4 is an information-reading device 50 using the information-reading elements in Examples 1 to 3.

Information-reading elements 51a and 51b are examples of elements for reading a bit pattern in an incremental linear encoder or rotary encoder. A scale having a dotted bit pattern relatively moves over these elements. The information-reading elements 51a and 51b perform reading all the time to enable to detect changes of the bit pattern, and the relative moving amount can be obtained.

Information-reading elements 52a to 52d are examples of elements for reading a bit pattern in an absolute linear encoder or rotary encoder. A scale having a bit pattern for positional detection relatively moves over these elements. The information-reading elements 52a to 52d perform reading as needed to enable to detect the bit pattern, and absolute positional information can be obtained. As the information-reading elements 51a and 51b, the information-reading elements 10a, 10b, 20, and 30 described in Examples 1 to 3 can be used. Also, as the information-reading elements 52a to 52d, the information-reading elements 10a, 10b, 20, and 30 described in Examples 1 to 3 can be used.

Figure 6:
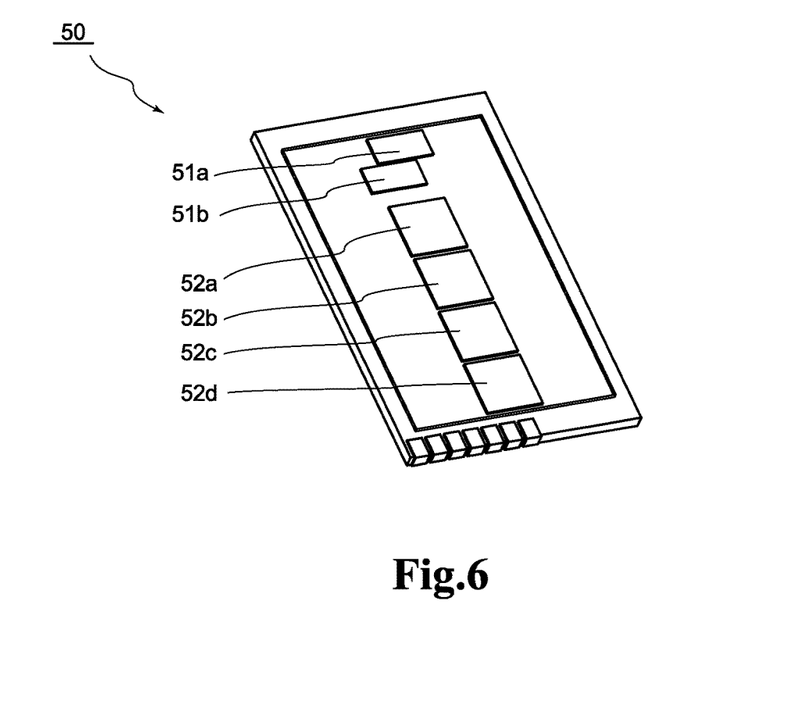
FIG. 6 is a perspective view illustrating an information-reading device according to the present invention.

All light emission and light reception wavelengths (light emission wavelengths of the light-emitting elements and light reception wavelengths at which light-receiving sensitivities of the light-receiving elements are peak) of the information-reading elements in FIG. 6 do not need to be equal as long as the light emission wavelength and the light reception wavelength of each information-reading element are equal. For example, in a case in which the light emission and light reception wavelengths of the adjacent information-reading elements differ, the polarized light leaking from one information-reading element to the other information-reading element has no influence. Thus, an arranging distance between the information-reading elements can be shorter, and consequently, further size reduction and high-resolution can be achieved.

Also, the light emission and light reception timing of the adjacent information-reading elements may be set not to be synchronous. In particular, in a case of using organic EL, blinking (turning on/off) can be performed quickly since a light emission principle thereof is the same as that of LED. By performing high frequency pulsed blinking, mutual interference between the adjacent information-reading elements can be eliminated while the information-reading elements are operated without increasing a time lag.

When this control in which the light emission and light reception timing is set not to be synchronous is used together with the above configuration in which the light emission and light reception wavelengths of the adjacent information-reading elements are set not to be equal, further size reduction and high-resolution can be achieved.

Next, evaluation examples regarding the light-receiving amount of the light-receiving element 11b in the information-reading element 10a described in Example 1 will be described based on FIG. 7.

The upper stage (A) of FIG. 7 schematically illustrates changes of the light-receiving amount of the light-receiving element 11b when presence/absence of the reflecting plate 13a is read with use of the information-reading element 10a.

Figures 7A, 7B:
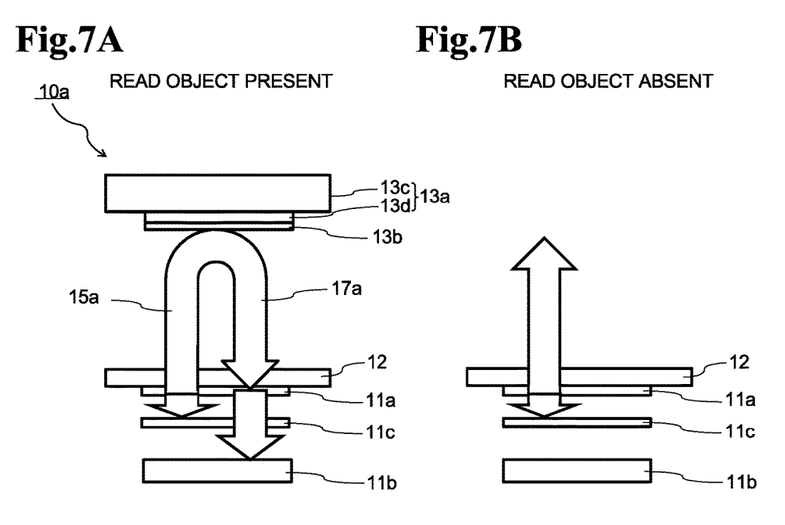
FIG. 7 describes an evaluation of a light-receiving intensity of a light-receiving element when the configuration of Example 1 according to the present invention is employed.

The light-receiving amount of the light-receiving element 11b when the reflecting plate 13a (the read object) is present illustrated in FIG. 7A is approximately 51 times as much as the light-receiving amount of the light-receiving element 11b when the reflecting plate 13a is absent illustrated in FIG. 7B.

Meanwhile, in the evaluation example illustrated in FIG. 7A, the reflecting plate 13a has a configuration of attaching aluminum foil 13d to a black plastic plate 13c to reflect light using the aluminum foil 13d. Also, the evaluation example is an evaluation in a case in which MCR-140N manufactured by MeCan Imaging Inc. is used as the quarter-wave plate 13b, in which a polarized organic EL element is used as the light-emitting element 11a, in which SHLP44 manufactured by MeCan Imaging Inc. is used as the polarizing plate 11c, and in which s1337-33BR manufactured by Hamamatsu Photonics K.K. is used as the light-receiving element 11b.

The lower stage (B) of FIG. 7 schematically illustrates changes of the light-receiving amount of the light-receiving element 11b when presence/absence of the reflecting plate 13a is read in a configuration of not including the quarter-wave plate 13b and the polarizing plate 11c.

Figures 7C, 7D:
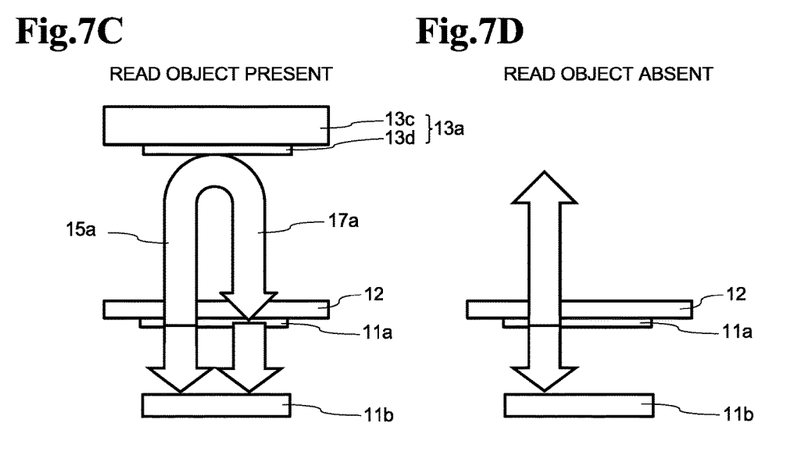

The light-receiving amount of the light-receiving element 11b when the reflecting plate 13a (the read object) is present illustrated in FIG. 7C is approximately 2.6 times as much as the light-receiving amount of the light-receiving element 11b when the reflecting plate 13a is absent illustrated in FIG. 7D.

Meanwhile, in the evaluation example illustrated in FIG. 7B, configurations of the reflecting plate 13a, the light-emitting element 11a, and the light-receiving element 11b are similar to those illustrated in FIG. 7A, except the configuration of not including the quarter-wave plate 13b and the polarizing plate 11c.

The information-reading element 10a includes the quarter-wave plate 13b and the polarizing plate 11c. Thus, in the information-reading element 10a, the light volume emitting from the light-emitting element 11a and directly entering the light-receiving element 11b can be kept small. Accordingly, as described in the evaluation example in FIG. 7A, according to the information-reading element 10a, the changing amount between the light-receiving amount of the light-receiving element 11b when the reflecting plate 13a is present and the light-receiving amount of the light-receiving element 11b when the reflecting plate 13a is absent can be large.

Figure 9:
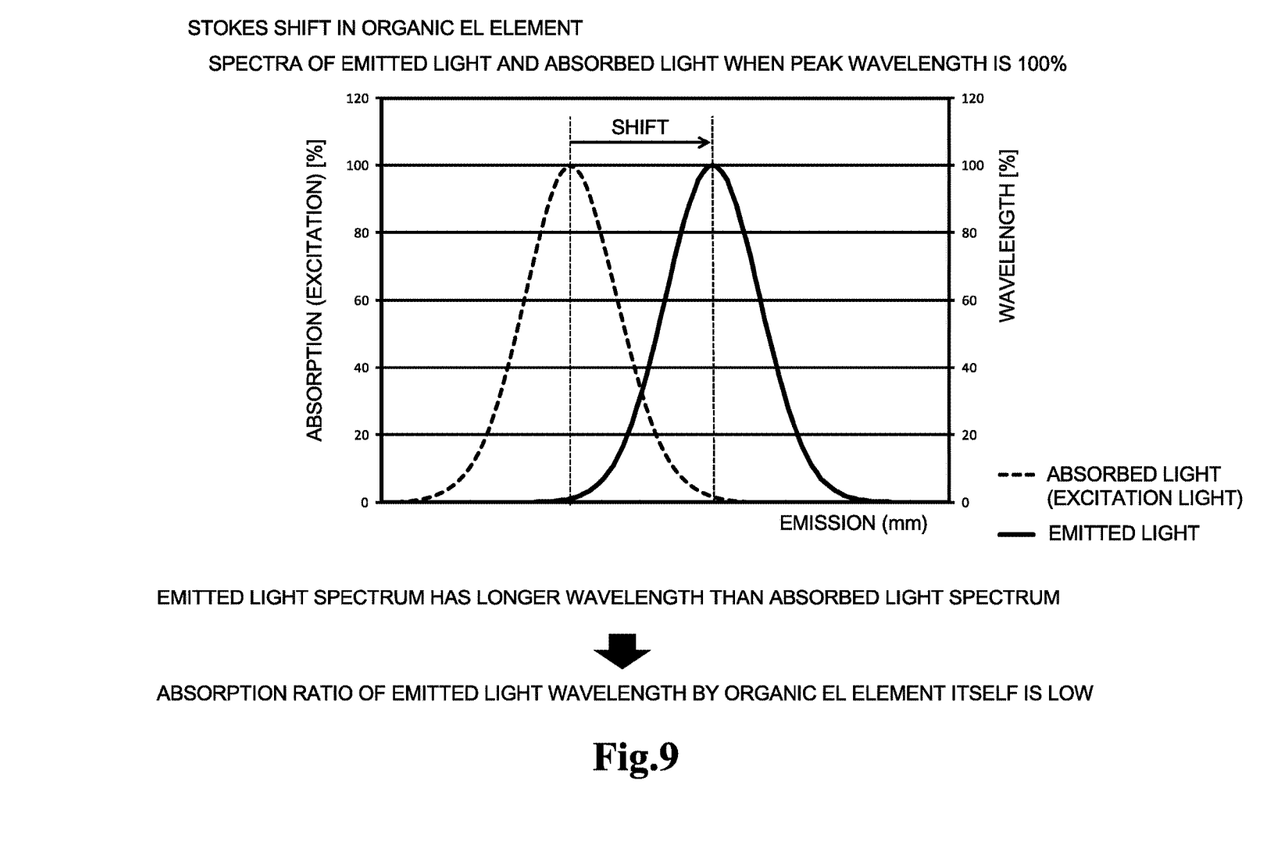
FIG. 9 is a graph illustrating a wavelength shift between excitation light and emitted light of an organic EL element.

In an organic EL element, light having a longer wavelength than that of excitation light is emitted (output). For example, as illustrated in FIG. 9, the wavelength of emitted light shifts to a long-wavelength side from the wavelength of light exciting a light-emitting layer of the organic EL element. Thus, in a case of using the organic EL element as the light-emitting element 11a, when light reflected on the reflecting plate 13a passes through the light-emitting element 11a again, the light has a longer wavelength than that of the excitation light. Accordingly, the absorbing amount of light in the light-emitting element 11a is reduced, and the light-receiving amount in the light-receiving element 11b can be increased.

As described in the aforementioned examples, the information-reading element 10a, 10b, 20, or 30 includes a polarized light emitting part (the light-emitting element 11a, 21a, or 31a) emitting polarized light as outgoing light, and a polarized light receiving part (the light-receiving element 11b, 21b, or 31b) receiving as returning light the outgoing light reflected on a read object (the reflecting plate 13a, 23a, or 33a) as an object from which information is read. The polarized light emitting part (the light-emitting element 11a, 21a, or 31a) and the polarized light receiving part (the light-receiving element 11*b*, 21*b*, or 31*b*) respectively have different polarization characteristics.

According to this configuration, even when the polarized light emitting part (the light-emitting element 11*a*, 21*a*, or 31*a*) and the polarized light receiving part (the light-receiving element 11*b*, 21*b*, or 31*b*) are laminated, the light volume entering from the polarized light emitting part (the light-emitting element 11*a*, 21*a*, or 31*a*) into the polarized light receiving part (the light-receiving element 11*b*, 21*b*, or 31*b*) can be reduced. Also, since the polarized light emitting part (the light-emitting element 11*a*, 21*a*, or 31*a*) and the polarized light receiving part (the light-receiving element 11*b*, 21*b*, or 31*b*) are laminated, size reduction of the information-reading element 10*a*, 10*b*, 20, or 30 can be achieved. Further, since positional adjustment of the polarized light emitting part (the light-emitting element 11*a*, 21*a*, or 31*a*) and the polarized light receiving part (the light-receiving element 11*b*, 21*b*, or 31*b*) does not require high accuracy, man-hours for adjustment can be reduced.

Also, in the information-reading element 10*a*, 10*b*, 20, or 30, a polarization characteristic changing part (the quarter-wave plate 13*b*, 23*b*, or 33*b*) changing polarization characteristics of the outgoing light and the returning light is arranged at a position through which the outgoing light and the returning light pass. The polarization characteristic changing part (the quarter-wave plate 13*b*, 23*b*, or 33*b*) gives rise to a change A (polarization toward a direction vertical to an arbitrary specific plane) in the polarization characteristic when the outgoing light passes therethrough and gives rise to a change B (polarization toward a direction parallel to the specific plane) in the polarization characteristic when the returning light passes therethrough so that the polarization characteristic of the returning light may match the polarization characteristic of the polarized light receiving part due to the change A and the change B.

According to this configuration, the polarization characteristics of the outgoing light and the returning light can be made different from each other reliably, and information reading accuracy can be improved.

Also, in the information-reading element 10*a*, 10*b*, 20, or 30, are arranged at positions where the polarized light emitting part (the light-emitting element 11*a*, 21*a*, or 31*a*), the polarized light receiving part (the light-receiving element 11*b*, 21*b*, or 31*b*), the read object (the reflecting plate 13*a*, 23*a*, or 33*a*), and the polarization characteristic changing part (the quarter-wave plate 13*b*, 23*b*, or 33*b*) intersect with equal lines.

According to this configuration, since the polarized light emitting part and the polarized light receiving part do not need to be arranged on an equal plane, a reflecting angle is 0. Thus, it is not necessary to provide refractive lenses. That is, the polarized light emitting part and the polarized light receiving part do not need to be arranged in parallel with each other in a direction of a plane of a substrate on which these parts are provided. For this reason, the reflecting angle of the outgoing light on the read object (the reflecting plate 13*a*, 23*a*, or 33*a*) can be 0 degrees. Accordingly, size reduction of the information-reading element 10*a*, 10*b*, 20, or 30 can be achieved. Also, since it is not necessary to provide the refractive lenses, for example, a distance between the polarized light emitting part or the polarized light receiving part and the reflecting part can further be shortened.

Also, in the information-reading element 10*a*, 10*b*, 20, or 30, the polarized light receiving part (the light-receiving element 11*b*, 21*b*, or 31*b*) is provided on an opposite side of the read object (the reflecting plate 13*a*, 23*a*, or 33*a*) with the polarized light emitting part (the light-emitting element 11*a*, 21*a*, or 31*a*) interposed therebetween, and the polarized light emitting part (the light-emitting element 11*a*, 21*a*, or 31*a*) has a light transmission characteristic, to enable the outgoing light emitted by the polarized light emitting part (the light-emitting element 11*a*, 21*a*, or 31*a*) to transmit through the polarized light emitting part (the light-emitting element 11*a*, 21*a*, or 31*a*) after being reflected on the read object (the reflecting plate 13*a*, 23*a*, or 33*a*) as the returning light and to reach the polarized light receiving part (the light-receiving element 11*b*, 21*b*, or 31*b*).

According to this configuration, the polarized light emitting part (the light-emitting element 11*a*, 21*a*, or 31*a*) and the polarized light receiving part (the light-receiving element 11*b*, 21*b*, or 31*b*) can be provided to be adjacent to the traces of the outgoing light and the returning light reciprocating on the equal traces, and the size of the information-reading element 10*a*, 10*b*, 20, or 30 can further be reduced.

The information-reading device 50 according to the present invention can include any one of the aforementioned information-reading elements 10*a*, 10*b*, 20, and 30. By configuring the information-reading device 50 in this manner, size reduction of the information-reading device 50 can be achieved.

Also, the information-reading device 50 according to the present invention includes the plurality of information-reading elements 10*a*, 10*b*, 20, and/or 30, and the information-reading elements 10*a*, 10*b*, 20, and/or 30 are provided so that wavelengths of polarized light emitted or received by the plurality of information-reading elements are different among the adjacent information-reading elements. By configuring the information-reading device 50 in this manner, information reading accuracy can be improved.

The information-reading element 10*a*, 10*b*, 20, or 30 includes a polarized light emitting part (the light-emitting element 11*a*, 21*a*, or 31*a*) emitting polarized light as outgoing light, a read object (the reflecting plate 13*a*, 23*a*, or 33*a*) reflecting the outgoing light emitted from this polarized light emitting part (the light-emitting element 11*a*, 21*a*, or 31*a*) as returning light, a polarized light receiving part (the light-receiving element 11*b*, 21*b*, or 31*b*) receiving the returning light reflected on the read object (the reflecting plate 13*a*, 23*a*, or 33*a*), and a polarization characteristic changing part (the quarter-wave plate 13*b*, 23*b*, or 33*b*) arranged at a position through which the outgoing light and the returning light pass and changing polarization characteristics of the outgoing light and the returning light passing therethrough. The polarized light emitting part (the light-emitting element 11*a*, 21*a*, or 31*a*) and the polarized light receiving part (the light-receiving element 11*b*, 21*b*, 31*b*) respectively have different polarization characteristics. The polarization characteristic changing part (the quarter-wave plate 13*b*, 23*b*, or 33*b*) gives rise to a change A in the polarization characteristic when the outgoing light passes therethrough and gives rise to a change B in the polarization characteristic when the returning light passes therethrough so that the polarization characteristic of the returning light may match the polarization characteristic of the polarized light receiving part (the light-receiving element 11*b*, 21*b*, or 31*b*) due to the change A and the change B.

In this configuration, since the outgoing light and the returning light have different polarization characteristics, the polarized light receiving part (the light-receiving element 11*b*, 21*b*, or 31*b*) receives only light reflected on the read object (the reflecting plate 13*a*, 23*a*, or 33*a*) out of the outgoing light emitted by the polarized light emitting part (the light-emitting element 11*a*, 21*a*, or 31*a*). Accordingly, a distance between the polarized light emitting part (the light-emitting element 11a, 21a, or 31a) and the polarized light receiving part (the light-receiving element 11b, 21b, or 31b) can be shortened, a reflecting angle between the outgoing light and the returning light can be small, and as a result, a distance between the substrate plane and the object can be shortened, thereby contributing to size reduction.

Although the present invention has been described above based on the preferred examples, it is to be understood that the present invention is not limited to these examples and can be altered in various ways without departing from the spirit of the invention.

INDUSTRIAL APPLICABILITY

It is possible to provide an information-reading device enabling size reduction, high-resolution, and cost reduction due to an information-reading element enabling mass production, and an efficient information reading operation can be performed by this device.

REFERENCE SIGNS LIST 10a information-reading element according to present invention
10b information-reading element according to present invention having another configuration
11a light-emitting element (vertical polarization)
11b light-receiving element
11c polarizing plate
12 glass substrate
13a reflecting plate
13b quarter-wave plate
15a outgoing light
15b outgoing light polarizing direction
15c outgoing light polarizing direction (circular)
17a returning light
17b returning light polarizing direction
17c returning light polarizing direction (circular)
20 information-reading element according to present invention
21a light-emitting element (vertical polarization)
21b light-receiving element (having sensitivity to horizontal polarization)
22 glass substrate
23a reflecting plate
23b quarter-wave plate
25a outgoing light
25b outgoing light polarizing direction
27a returning light
27b returning light polarizing direction
30 information-reading element according to present invention
31a light-emitting element (vertical polarization)
31b light-receiving element
31c polarizing plate
31d light-receiving element
32 glass substrate
33a reflecting plate
33b quarter-wave plate
35a outgoing light
35b outgoing light polarizing direction
37a returning light
37b returning light polarizing direction
50 information-reading device according to present invention
51a information-reading element
51b information-reading element
52a information-reading element
52b information-reading element
52c information-reading element
52d information-reading element
60 conventional information-reading element
61 light-emitting element
62 light-receiving element
63 substrate
64 object
65a outgoing light
65b outgoing light
67 returning light
θ reflecting angle
d distance between light-emitting element and light-receiving element
h distance between light-emitting element or light-receiving element and object

The invention claimed is:
1. An information-reading element comprising:
a polarized light emitting part emitting polarized light as outgoing light; and
a polarized light receiving part receiving as returning light the outgoing light reflected on a read object as an object from which information is read,
the polarized light emitting part and the polarized light receiving part respectively having different polarization characteristics,
wherein
a polarization characteristic changing part changing polarization characteristics of the outgoing light and the returning light is arranged at a position through which the outgoing light and the returning light pass,
the polarization characteristic changing part gives rise to a change A in the polarization characteristic when the outgoing light passes therethrough and gives rise to a change B in the polarization characteristic when the returning light passes therethrough so that the polarization characteristic of the returning light may match the polarization characteristic of the polarized light receiving part due to the change A and the change B,
the polarized light emitting part, the polarized light receiving part, the read object, and the polarization characteristic changing part are arranged at positions intersecting with a same optical axis, and
the polarized light receiving part is provided on an opposite side of the read object with the polarized light emitting part interposed between the polarized light receiving part and the read object, and the polarized light emitting part has a light emitting characteristic of linear polarization and has a light transmission characteristic which passes the polarized light having the same polarizing direction of the emitted light and passes the polarized light having polarizing direction differs by 90 degrees from emitted light, the outgoing light emitted by the polarized light emitting part transmitting through the polarized light emitting part after being reflected on the read object as the returning light and the outgoing light reaching the polarized light receiving part.

2. An information-reading device comprising:
the information-reading element according to claim 1.

3. An information-reading device comprising:
a plurality of information-reading elements, each of which is the information-reading element according to claim 1, wavelengths of polarized light emitted or received by the plurality of information-reading elements being different among the adjacent information-reading elements.

* * * * *